United States Patent [19]
Swanson

[11] Patent Number: 5,750,983
[45] Date of Patent: May 12, 1998

[54] METER SENSOR LIGHT TAMPER DETECTOR

[75] Inventor: Scott C. Swanson, Roswell, Ga.

[73] Assignee: Schlumberger Industries, Inc., Norcross, Ga.

[21] Appl. No.: 779,330

[22] Filed: Jan. 6, 1997

Related U.S. Application Data

[63] Continuation of Ser. No. 407,143, Mar. 20, 1995, abandoned.

[51] Int. Cl.$^6$ ..................... G01D 5/30
[52] U.S. Cl. ............... 250/231.13; 324/110
[58] Field of Search ............... 250/231.13, 221, 250/222.1; 324/110

[56] References Cited

U.S. PATENT DOCUMENTS

| | | | |
|---|---|---|---|
| 4,061,925 | 12/1977 | van der Gaag et al. | 250/553 |
| 4,327,362 | 4/1982 | Hoss | 340/870.02 |
| 4,614,945 | 9/1986 | Brunius et al. | 340/870.03 |
| 4,629,877 | 12/1986 | Sato et al. | 250/201 |
| 4,665,359 | 5/1987 | Goodwin | 324/110 |
| 4,680,704 | 7/1987 | Konicek et al. | |
| 4,728,950 | 3/1988 | Hendrickson et al. | |
| 4,733,169 | 3/1988 | Grindahl | 324/79 D |
| 4,786,903 | 11/1988 | Grindahl et al. | 340/825.54 |
| 4,799,059 | 1/1989 | Grindahl et al. | 340/870.03 |
| 4,827,123 | 5/1989 | Gray | |
| 4,876,700 | 10/1989 | Grindahl | 375/87 |
| 4,956,551 | 9/1990 | Repschlager et al. | 250/231.14 |
| 5,036,187 | 7/1991 | Yoshida et al. | 250/214 B |
| 5,095,203 | 3/1992 | Sato et al. | 250/222.1 |
| 5,113,130 | 5/1992 | Balch | 324/74 |
| 5,142,134 | 8/1992 | Kunkel | 250/205 |
| 5,170,051 | 12/1992 | Pistouley | |
| 5,214,587 | 5/1993 | Green | |
| 5,241,306 | 8/1993 | Swanson | 340/870.29 |
| 5,261,275 | 11/1993 | Davis | |

Primary Examiner—Stephone B. Allen
Attorney, Agent, or Firm—Townsend and Townsend and Crew LLP

[57] ABSTRACT

A meter sensor light tamper detector includes at least one light emitter and one or more sensors. The sensors have some parameter, i.e., conductivity in the case of phototransistor sensors, to provide an indication that they are in the presence of light. The system also includes a microprocessor which is capable of independent control of the light emitter and the sensors, and can determine the state of the electrical parameter, i.e., conductivity or nonconductivity, of the sensors. The microprocessor determines whether the sensors are being tampered with by checking the state of the sensors when a particular light condition is known to be present or absent.

19 Claims, 2 Drawing Sheets

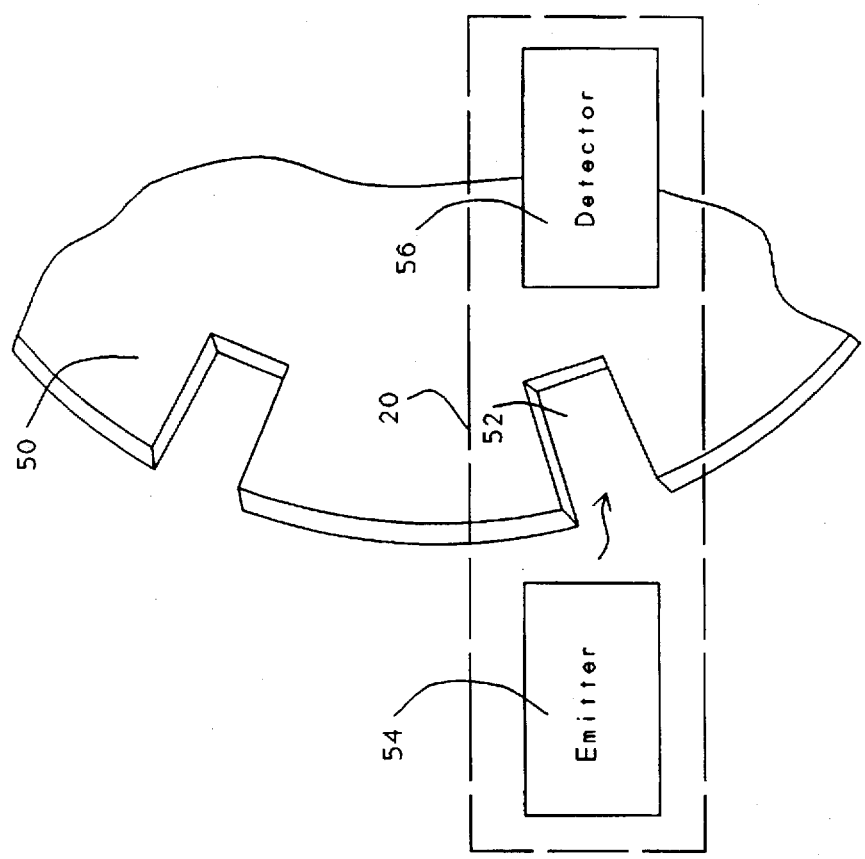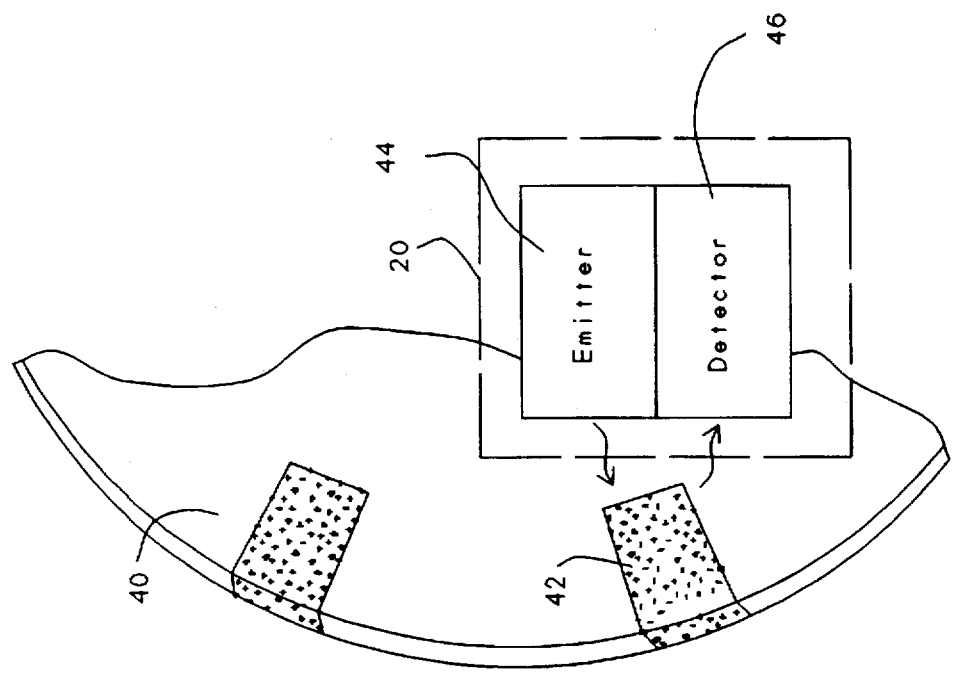

METER SENSOR LIGHT TAMPER DETECTOR

This is a continuation of application Ser. No. 08/407,143, filed Mar. 20, 1995 now abandoned, the disclosure of which is incorporated by reference.

BACKGROUND OF THE INVENTION

The present invention relates to a light sensor. In particular, the invention relates to the detection of tampering with a light sensor used in the automatic reading of utility meters such as those used in the electric utility industry. Particularly, the invention relates to a method and apparatus for determining whether an optical sensor used for measuring rotation of a shaft or disk of a meter is the subject of tampering.

Electric utilities use attachments to electro-mechanical meters to perform monitoring functions such as demand and time-of-use metering or remote meter sensing. The electro-mechanical meters often include a rotating disk or shaft which rotates at a rate proportional to power usage. Sensors or other measuring devices are used to monitor the rotation of the disk or shaft. A standard approach to sensing the rotation of the disk involves the use of light emitting diodes and photosensors. Essentially, the diodes emit light which is sensed by the optical sensors when the disk is in a certain position. This provides an efficient means to track rotation of the disk. Revolution information is stored in electronic registers for use by the utility.

Several techniques are used to implement optical sensing. One common arrangement, referred to as "through-hole sensing", involves the placement of one or more apertures along an outer periphery of a rotating disk. The disk separates one or more light emitting diodes from a corresponding number of photosensors. As the disk rotates and the apertures pass through the path of the optical sensing area, the photosensor is illuminated. This causes a voltage threshold in the sensing circuit to be exceeded. The voltage threshold is set to correspond to the light exposure condition. As the non-aperture portions of the disk pass between the diode and the sensors the light transmission is blocked to prevent the voltage threshold from being exceeded. An electronic register in the meter sensing system is used to store information regarding the number of revolutions made by the disk.

In another common arrangement, referred to as "reflective sensing", the disk is provided with a darkened light absorbing area instead of one or more apertures. Light is emitted onto the rotor disk. The light is reflected to a detector if the light hits the reflective portion of the disk, otherwise, the light is absorbed by the darkened area. Power usage is determined by tracking the number of transitions sensed by the detector circuit. A meter reading scheme using such a variation is disclosed in U.S. Pat. No. 4,327,362, issued to Hoss on Apr. 27, 1982.

Other sensing approaches are also used. Shutters or notches may be placed around the periphery of disks or on a meter disk spindle. Emitters and photosensors are then used to detect movement of these shutters. Such optical sensing of movement can be used in any mechanically convenient place within a meter system. An example of a sensing scheme using rotation of a disk spindle is shown and described in U.S. Pat. No. 5,241,306, issued to Swanson on Aug. 31, 1993.

Although each of these sensing approaches have slightly different characteristics and features, they share a common need to provide reliable and consistent sensing. If the sensing of a meter's rotation fails, even temporarily, the electronic register information will be in error. Current systems suffer in that high levels of ambient light can cause temporary failure of a sensor. Dishonest customers have been known to evade meter sensing devices by directing a light source at the meter sensor.

Filtering schemes have been proposed to prevent such tampering. One effective filtering scheme is described in the co-pending and commonly-assigned application entitled AMBIENT LIGHT FILTER filed herewith on Mar. 20, 1995 and assigned Ser. No. 08/407,154, now abandoned and from which a continuation application was filed on Nov. 20, 1996 and assigned Ser. No. 08/745,834, which is incorporated herein by reference. However, in some situations it is desirable to take some remedial action when a meter has been subject to tampering. For example, where a dishonest user exhibits a pattern of tampering or engages in prolonged acts of tampering, an electric utility may wish to take action against the dishonest user by terminating service or the like. Thus, it would be desirable to provide an approach for alerting the utility of such abuse. It is further desirable to provide such a feature without increasing the cost or complexity of current meter sensor designs.

As automatic meter reading systems, i.e., radio frequency ("RF") systems become more prevalent, automatic means to recognize that a meter has been tampered with also become more important. This is because a utility will no longer be able to rely upon the meter reader (who formerly read the meter and could observe any obvious tampering) to observe that a meter has been tampered with. Such RF systems are sold by the assignee of the present invention as well as by other companies, and they are described in numerous U.S. patents, including U.S. Pat. No. 4,614,945 of Brunius, et al.; U.S. Pat. No. 4,733,169 of Grindahl; U.S. Pat. No. 4,786,903 of Grindahl, et al.; U.S. Pat. No. 4,799,059 of Grindahl, et al.; and U.S. Pat. No. 4,876,700 of Grindahl.

In view of the above, it would be desirable to provide a method and apparatus for automatically providing an indication of tampering with a meter disk sensor without increasing the cost or complexity of a sensor.

SUMMARY OF THE INVENTION

Accordingly, a meter sensor light tamper detector is provided which allows monitoring and detection of any tampering with a meter sensor. According to the present invention, a tamper detector includes at least one emitter and one or more sensors. The sensors are conductive in the presence of light. The system also includes a microprocessor which is capable of independent control of the emitter and the sensors, and can determine the state of conductivity or nonconductivity of the sensors. The firmware controlling the microprocessor determines whether the sensors are being tampered with by checking the state of the sensors.

In one specific embodiment, the microprocessor first ensures that the emitter (or emitters) are turned off, and then checks whether any of the sensors are conductive. If a sensor is conductive when no meter light source is present, the firmware controlling the microprocessor concludes that some tampering is occurring.

In another specific embodiment, for use in meter systems where only a single sensor is designed to be illuminated at any time, the microprocessor checks both sensors for their conductivity. If both are conductive, the microprocessor concludes that the meter is being tampered with.

The tamper detector of the present invention may be used in any of a number of meter sensor designs. For a fuller

BRIEF DESCRIPTION OF THE DRAWINGS

FIGS. 2A-2B illustrate differing optical sensor arrangements for use with embodiments of the present invention.

DESCRIPTION OF THE PREFERRED EMBODIMENT

Figure 1:
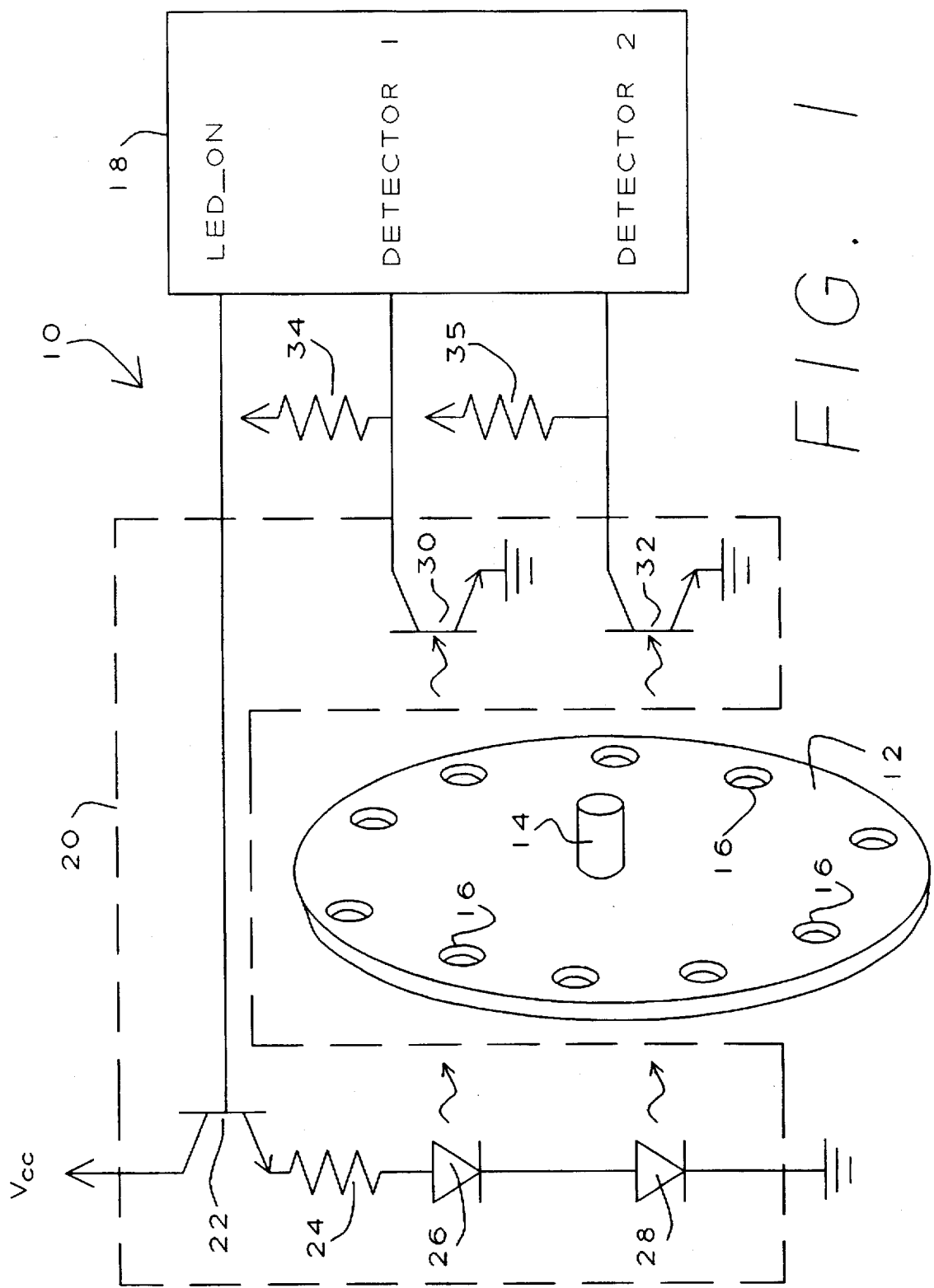
FIG. 1 is a schematic diagram of an embodiment of a meter sensor light tamper detector according to the present invention.

FIG. 1 illustrates one specific embodiment of a meter sensor light tamper detector according to the present invention. The system includes a meter disk 12, a microprocessor 18, and an optical sensing unit 20. FIG. 1 depicts an embodiment for use with a through-hole sensing arrangement. The disk 12 rotates about an electricity meter shaft 14 and includes a number of apertures 16 spaced about the periphery of the disk. Those skilled in the art will recognize that any number of apertures may be employed. Further, although a specific embodiment for use in a through-hole sensing arrangement is described, the system of the present invention may be readily adapted for use with any sensing arrangement which relies on the detection of changes in light.

The optical sensing unit 20 shown in FIG. 1 includes a pair of light emitting diodes 26, 28 and a pair of phototransistors 30, 32. Although a pair of each is shown, any number may be used with the tamper detector of the present invention. Further, a system may include more sensors than emitters and vice versa.

The apertures 16 of the disk 12 are positioned to allow passage of light between the diodes 26, 28 and the optical sensors 30, 32 when the disk rotates. The light emitting diodes 26, 28 are connected between a voltage supply Vcc and ground through a series connection of switching transistor 22 and resistor 24.

An output, LED_ON, of a microprocessor 18 is connected to supply driving signal pulses to switching transistor 22. Phototransistors 30, 32 are rendered conductive by light directed at their base. In this specific embodiment the collectors of each phototransistor 30, 32 are connected to inputs of the microprocessor 18 labeled DETECTOR 1 and DETECTOR 2, respectively. These connections are pulled to Vcc through pull-up resistors 34, 36. The emitters of phototransistors 30, 32 are coupled to ground.

Operation of the meter sensor light tamper detector is controlled by operation of the microprocessor 18. Specifically, the microprocessor 18 checks to see if the phototransistors 30, 32 are illuminated (i.e., conductive) at a time when they should not be during normal operation. According to one specific embodiment of the present invention, the microprocessor 18 ensures that the light emitting diodes 26, 28 are turned off by asserting line LED_ON low. This disables switching transistor 22 so that no current flows through resistor 24 or diodes 26, 28. Once the light emitting diodes 26, 28 are off, the microprocessor 18 checks to determine whether either phototransistor 30 or 32 is conductive (i.e., whether the optical detector is sensing light). If either phototransistor is conductive, the microprocessor 18 recognizes that the meter sensor is being tampered with by the introduction of a strong external light. The microprocessor 18 can then set an alarm condition or otherwise notify the utility of the tampering. The system may be configured to store information regarding each occurrence of tampering and report it to the utility when a certain amount of tampering has occurred.

In another specific embodiment, two (or more) phototransistors 30, 32 are arranged so that both are never illuminated at the same time by the optical emitters 26, 28. That is, apertures 16 in the disk 12 are not positioned to pass light to both sensors at the same time. Rather, they are staggered. The microprocessor 18 may then read the state of both phototransistors 30, 32 at substantially the same time. If both light detectors are conductive (i.e., sense an amount of light), the microprocessor 18 recognizes that the meter sensor is being tampered with by the artificial introduction of a strong light. Again, the microprocessor 18 may then take appropriate action such as setting an alarm condition or the like. The microprocessor 18 may continually repeat these tamper checks in conjunction with normal monitoring of rotation of the disk 12.

The meter sensor light tamper detector according to the present invention may be implemented with any sensor arrangement. For example, referring now to FIG. 2, two different meter rotation sensing arrangements are shown which may be used with embodiments of the present invention. In FIG. 2A a meter disk 40 is shown which includes at least one non-reflective patch 42. The optical sensor system 20 includes at least one emitting device 44 (e.g., a light emitting diode) and at least one detector device 46 (e.g., a phototransistor). The system registers the non-conductance of the detector device 46 (e.g., when the sensor is positioned over the non-reflective patch 42). Such an arrangement may be augmented with the meter sensor light tamper detection system of the present invention to detect misrecognition of disk 40 movement due to the introduction of a strong light by a dishonest utility user.

FIG. 2B depicts yet another arrangement which may be augmented using the tamper detection system of the present invention. In this implementation, at least one shutter or notch 52 is formed in a disk 50. As the disk 50 rotates, an optical sensor system 20 registers the movement. Again, the optical sensor system 20 includes at least one emitter 54 and at least one detector 56.

Although a number of specific embodiments have been described, those skilled in the art will recognize that a number of variations of the present invention may be made. For example, the sensors may be located at any mechanically convenient location within a meter, such as on a gear, dial, disk, or the like. Although the use of light emitting diodes and phototransistors has been described, those skilled in the art will recognize that the present invention may be implemented with any light emitting and detecting device. Further, although a specific application has been described, the light tamper detection system may be used in any application where it is desirable to identify tampering with optical sensors.

Accordingly, the disclosure of the invention is intended to be illustrative, but not limiting, of the scope of the invention which is set forth in the following claims. In that regard, while a specific, preferred embodiment of the invention has been described herein with reference to light emitting diodes and phototransistors, the invention is not intended to be limited thereby. For example, photovoltaic cells, photoresistive cells, or photodiodes could be used in place of the phototransistors described herein with respect to the preferred embodiment of the invention (with suitable, minor changes to the remaining circuitry). Accordingly, as used herein, the term "phototransistors" is intended to include all electronic elements in which the detection of varying degrees of light can be related to an electronic signal.

I claim:

1. A meter sensor light tamper detector, comprising:
   a first and a second light sensor, each being in a first operating state in the presence of an amount of light and in a second operating state in the absence of said amount of light;
   a first light emitter operable to illuminate at least said first light sensor with said amount of light; and
   a microprocessor determining said first and second operating states of said first and said second sensors and controlling emission of said first light emitter, wherein said microprocessor recognizes said meter sensor is subject to tampering whenever it determines said first and second light sensors are both in said first operating state at a time when said first light emitter is emitting said amount of light.

2. The tamper detector of claim 1 further comprising a second light emitter operable to illuminate at least said second light sensor with said amount of light and controlled by said microprocessor to emit said amount of light concurrently with said first light emitter.

3. The tamper detector of claim 1 further comprising a meter disk, said meter disk disposed proximate to said first light emitter.

4. The tamper detector of claim 3 wherein said first light emitter is positioned to reflect light off a surface of said meter disk and wherein said first and second light sensors are positioned to detect the reflection of said light off said surface.

5. The tamper detector of claim 3 wherein said meter disk has a plurality of light absorbing areas.

6. The tamper detector of claim 3 wherein said meter disk has a plurality of apertures.

7. The tamper detector of claim 6 wherein said first light emitter is positioned to create a light path through at least one of said plurality of apertures and wherein one of said first and second light sensors is positioned in said light path when said meter disk is in a specific rotational position.

8. The tamper detector of claim 1 wherein said microprocessor sets an alarm condition whenever said first light sensor and said second light sensor are both in said first operating state.

9. The tamper detector of claim 1 wherein said microprocessor notifies a monitor whenever said first light sensor and said second light sensor are both in said first operating state.

10. The tamper detector of claim 1 wherein said first operating state is an electrically conductive state and said second operating state is an electrically nonconductive state.

11. A method for detecting tampering of a meter sensor, including a first light emitter and a first and a second light sensor, for use with a meter including a rotor shaft having a disk affixed thereto, said disk having at least a first opening positioned to pass light from said first light emitter to said first light sensor when the disk is in a first position, the method comprising the steps of:
    causing said first light emitters to became conductive;
    checking at substantially the same time whether said first light sensor and said second light sensor are in a particular operating state while said first light emitter is conductive; and
    establishing that said meter sensor is subject to tampering whenever said step of checking indicates that both said first light sensor and said second light sensor are in said particular operating state.

12. The method of claim 11 further comprising the step of notifying a monitor that tampering is occurring.

13. The method of claim 11 wherein said particular operating state is an electrically conductive state.

14. The method of claim 13 wherein said meter sensor includes a second light emitter, and said step of causing said first light emitter to become conductive further includes the step of causing said second light emitter to become conductive at substantially the same time, and wherein said second light emitter is also conductive during said step of checking said first and second light sensors.

15. The method of claim 14 wherein said disk includes a second opening positioned to pass light from said second light emitter to said second light sensor when said disk is in a second position, said first opening and said second opening being arranged such that light cannot simultaneously be received by both said first light sensor and said second light sensor from said first light emitter and second light emitter, respectively.

16. A method for detecting tampering of a meter sensor, the method comprising the steps of:
    turning on a first light emitter;
    checking whether a first light sensor is conductive or noncondutive while said first light emitter is on, said first light emitter selectively conveying light to said first light sensor;
    checking a second light sensor to determine whether said second light sensor is conductive or nonconductive at the same time as said first light sensor; and
    establishing that said meter sensor is subject to tampering whenever said steps of checking indicate that both said first light sensor and said second light sensor are conductive.

17. The method of claim 16 further comprising the steps of turning on a second light emitter and keeping said second light emitter on during said steps of checking said first and second light sensors, said second light emitter selectively conveying light to said second light sensor.

18. A system for detecting tampering of a meter sensor for use with a meter including a rotor shaft, the system comprising:
    a first light emitter and a second light emitter;
    a first light sensor and a second light sensor disposed proximate to said first light emitter and said second light emitter, respectively;
    a disk affixed to the rotor shaft, said disk having a first opening positioned to pass light from said first light emitter to said first light sensor when said disk is in a first position, and a second opening position to pass light from said second light emitter to said second light sensor when said disk is in a second position, said first and second openings being arranged such that light cannot simultaneously be received by both said first light sensor and said second light sensor from said first light emitter and said second light emitter, respectively;
    a microprocessor having a first input for receiving a first signal indicative of the conductivity or nonconductivity of said first light sensor;
    said microprocessor further having a second input for receiving a second signal indicative of the conductivity or nonconductivity of a second light sensor;
    wherein said microprocessor determines that said meter sensor is being tampered with by receiving signals indicating that both said first and second light sensors are conductive at the same time while said first and second light emitters are asserted.

19. A system for detecting tampering of a meter sensor for use with a meter including a rotor shaft, the system comprising:

a light emitter;

a first light sensor and a second light sensor disposed proximate to said first light emitter;

a disk affixed to the rotor shaft, said disk having a first opening positioned to pass light from said light emitter to said first light sensor when said disk is in a first position, and a second opening positioned to pass light from said light emitter to said second light sensor when said disk is in a second position, said first opening and said second opening being arranged such that light from said emitter cannot simultaneously be received by both said first light sensor and said second light sensor;

a microprocessor having a first input for receiving a signal indicative of the conductivity or nonconductivity of said first light sensor, and a second input for receiving a signal indicative of the conductivity or nonconductivity of said second light sensor;

wherein said microprocessor determines that said meter sensor is being tampered with by the receipt at about the same time of both a signal indicative of the conductivity of said first light sensor and a signal indicative of the conductivity of said second light sensor while said emitter is asserted.

* * * * *